US010896832B2

(12) United States Patent
Yamada et al.

(10) Patent No.: US 10,896,832 B2
(45) Date of Patent: Jan. 19, 2021

(54) SUBSTRATE PROCESSING METHOD AND SUBSTRATE PROCESSING APPARATUS

(71) Applicant: TOKYO ELECTRON LIMITED, Tokyo (JP)

(72) Inventors: Kazuhito Yamada, Miyagi (JP); Hiroki Endo, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/425,114

(22) Filed: May 29, 2019

(65) Prior Publication Data
US 2019/0371634 A1 Dec. 5, 2019

(30) Foreign Application Priority Data

May 31, 2018 (JP) .................................. 2018-104881

(51) Int. Cl.
*H01L 21/67* (2006.01)
*H01L 21/3065* (2006.01)
*H01L 21/66* (2006.01)
*H01J 37/32* (2006.01)

(52) U.S. Cl.
CPC .. *H01L 21/67248* (2013.01); *H01J 37/32522* (2013.01); *H01L 21/3065* (2013.01); *H01L 21/67253* (2013.01); *H01L 22/14* (2013.01); *H01J 2237/334* (2013.01)

(58) Field of Classification Search
CPC ............ H01L 21/67248; H01L 21/3065; H01J 37/3252
USPC ...................................................... 438/334
See application file for complete search history.

(56) References Cited

U.S. PATENT DOCUMENTS

2007/0292598 A1  12/2007  Tada et al.
2017/0372928 A1  12/2017  Yamada et al.
2018/0059168 A1*  3/2018  Jung ................. H01J 37/32724

FOREIGN PATENT DOCUMENTS

JP     2006-283173 A    10/2006
JP     2017-228230 A    12/2017

* cited by examiner

*Primary Examiner* — Elias Ullah
(74) *Attorney, Agent, or Firm* — Rothwell, Figg, Ernst & Manbeck, P.C.

(57) ABSTRACT

In substrate processing method, a change in a voltage, which is applied to a component provided in a substrate processing apparatus configured to process a substrate, is measured and a current flowing through the component is measured. A temperature of the component is obtained from a change in a resistance calculated based on the voltage and the current with reference to a conversion table in which a plurality of resistances is correlated with a plurality of temperatures. A determination of whether or not abnormality has occurred in a temperature of the substrate is made based on the change in the voltage, and processing of the substrate is stopped when it is determined that the abnormality has occurred.

20 Claims, 11 Drawing Sheets

SUBSTRATE PROCESSING METHOD AND SUBSTRATE PROCESSING APPARATUS

CROSS-REFERENCE TO RELATED APPLICATIONS

This application claims priority to Japanese Patent Application No. 2018-104881 filed on May 31, 2018, the entire contents of which are incorporated herein by reference.

TECHNICAL FIELD

The present disclosure relates to a substrate processing method and a substrate processing apparatus.

BACKGROUND

In a plasma etching process of a semiconductor wafer, there is known an interlock technique for stopping the plasma etching process when abnormality has occurred in a temperature of the semiconductor wafer.
Patent Document 1: Japanese Patent Application Publication No. 2006-283173
Patent Document 2: Japanese Patent Application Publication No. 2017-228230
The present disclosure provides a technique for appropriately determining whether or not abnormality has occurred in a temperature of a substrate.

SUMMARY

In accordance with an embodiment, there is provided a substrate processing method including: measuring a change in a voltage applied to a component provided in a substrate processing apparatus configured to process a substrate and a current flowing through the component; obtaining a temperature of the component from a change in a resistance calculated based on the voltage and the current with reference to a conversion table in which a plurality of resistances is correlated with a plurality of temperatures; determining whether or not abnormality has occurred in a temperature of the substrate based on the change in the voltage; and stopping processing of the substrate when it is determined that the abnormality has occurred.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments of a substrate processing method and a substrate processing apparatus will be described in detail with reference to the accompanying drawings. The following embodiments are not intended to limit the scope of the present disclosure and may be appropriately combined as long as the processing steps therein are not contradictory to each other.

<Configuration of Substrate Processing Apparatus 10>

Figure 1:
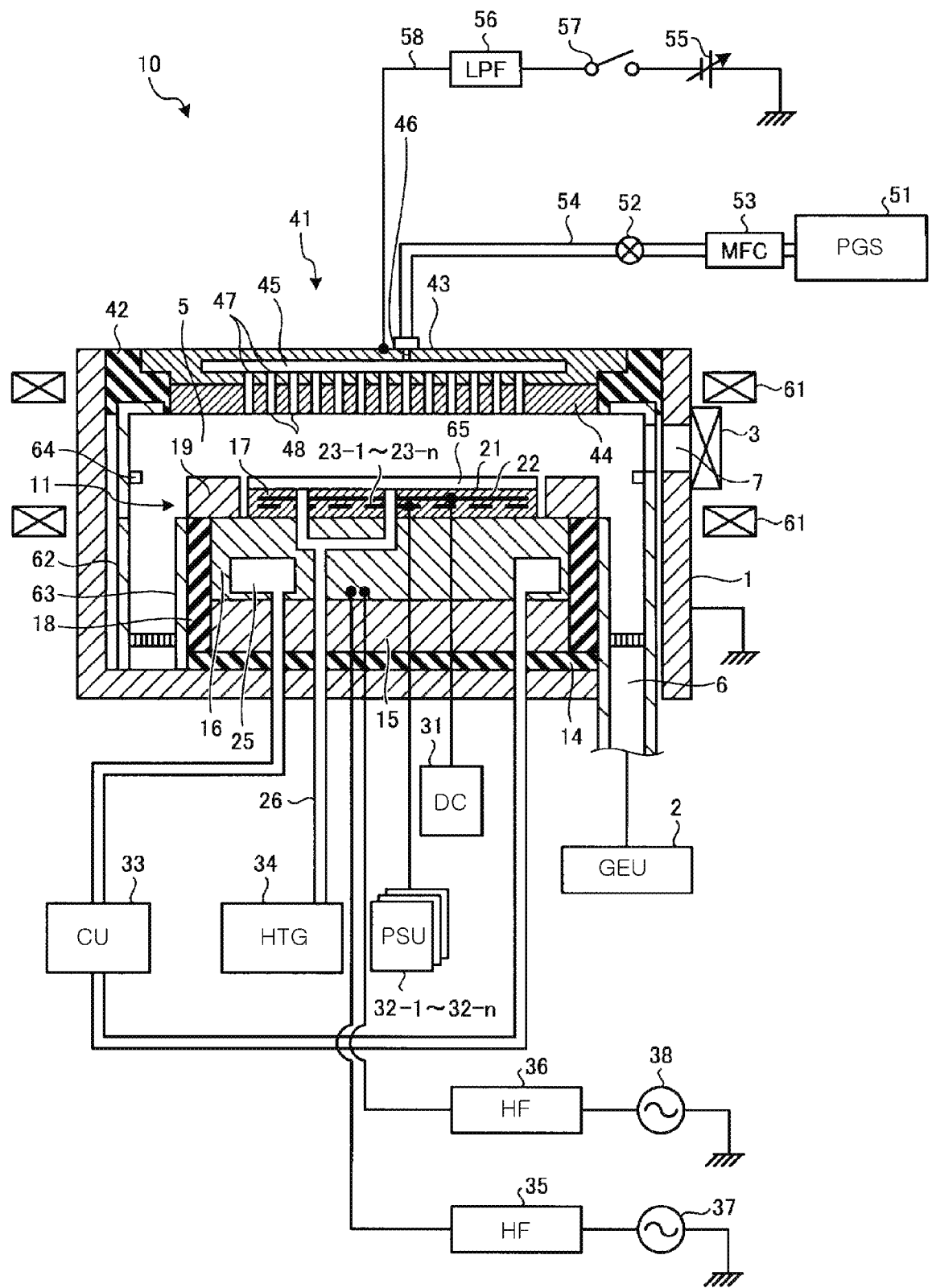
FIG. 1 is a vertical cross sectional view showing an example of a substrate processing apparatus.

FIG. 1 is a vertical cross sectional view showing an example of a substrate processing apparatus 10. As shown in FIG. 1, the substrate processing apparatus 10 includes a chamber 1, a gas exhaust unit (GEU) 2, and a gate valve 3. The chamber 1 is made of aluminum and formed in a substantially cylindrical shape. The surface of the chamber 1 is coated with an anodically oxidized film. A processing space 5 is formed in the chamber 1. The chamber 1 isolates the processing space 5 from an external atmosphere. A gas exhaust port 6 and an opening 7 are formed at the chamber 1. The gas exhaust port 6 is formed at a bottom portion of the chamber 1. The opening 7 is formed at a sidewall of the chamber 1. The gas exhaust unit 2 is connected to the processing space 5 of the chamber 1 through the gas exhaust port 6. The gas exhaust unit 2 exhausts the gas from the processing space 5 through the gas exhaust port 6 and decreases a pressure in the processing space 5 to a predetermined vacuum level. The opening 7 is opened and closed by the gate valve 3.

<Configuration of Mounting Table 11>

The substrate processing apparatus 10 further includes a mounting table 11. The mounting table 11 is disposed at a lower part of the processing space 5. The mounting table 11 includes an insulating plate 14, a support 15, a base 16, an electrostatic chuck 17, an inner wall member 18, and a focus ring 19. The insulating plate 14 is made of an insulator and is supported at the bottom portion of the chamber 1. The support 15 is made of a conductor. The support 15 is disposed on the insulating plate 14 and supported at the bottom portion of the chamber 1 via the insulating plate 14 to electrically insulate the support 15 and the chamber 1.

The base 16 is made of a conductor, e.g., aluminum. The base 16 is disposed on the support 15 and supported at the bottom portion of the chamber 1 via the support 15. The electrostatic chuck 17 is disposed on the base 16 and supported at the bottom portion of the chamber 1 via the base 16. The electrostatic chuck 17 includes an electrostatic chuck body 21, an electrode 22, and a plurality of heaters 23-1 to 23-$n$ (n is an integer greater than two). The electrostatic chuck body 21 is made of an insulator. The electrode 22 and the heaters 23-1 to 23-$n$ are embedded in the electrostatic chuck body 21.

The inner wall member 18 is made of an insulator, e.g., quartz, and formed in a cylindrical shape. The inner wall member 18 is disposed to surround the base 16 and the support 15 so that the base 16 and the support 15 are disposed at an inner side of the inner wall member 18. The focus ring 19 is made of single crystalline silicon and formed in a ring shape. The focus ring 19 is disposed to surround the electrostatic chuck 17 so that the electrostatic chuck 17 is disposed at an inner side of the focus ring 19. A coolant circulation path 25 and a heat transfer gas supply path 26 are formed in the mounting table 11. The coolant circulation path 25 is formed in the base 16. The heat transfer gas supply path 26 is formed to penetrate through the electrostatic chuck 17, and one ends of the heat transfer gas supply path 26 is formed on the upper surface of the electrostatic chuck 17.

The substrate processing apparatus 10 further includes a DC power supply (DC) 31, a plurality of power supply units (PSU) 32-1 to 32-$n$, a chiller unit (CU) 33, and a heat transfer gas supply unit (HTG) 34. The DC power supply 31 is electrically connected to the electrode 22 of the electrostatic chuck 17. The DC power supply 31 applies a DC voltage to the electrode 22. The power supply units 32-1 to 32-$n$ are provided in one-to-one correspondence with the heaters 23-1 to 23-$n$. The chiller unit 33 is connected to the coolant circulation path 25. The chiller unit 33 cools a coolant to a predetermined temperature and allows the cooled coolant to circulate through the coolant circulation path 25 in the base 16. The heat transfer gas supply unit 34 is connected to the heat transfer gas supply path 26. The heat transfer gas supply unit 34 supplies a heat transfer gas, e.g., He gas, to the heat transfer gas supply path 26.

The substrate processing apparatus 10 further includes a first high frequency power supply (HF) 35 and a second high frequency power supply (HF) 36. The first high frequency power supply 35 is connected to the base 16 through a first matching unit 37. The second high frequency power supply 36 is connected to the base 16 through a second matching unit 38. The first high frequency power supply 35 supplies a high frequency power of a predetermined frequency (e.g., 100 MHz) to the base 16. The second high frequency power supply 36 supplies to the base 16 a high frequency power of a frequency (e.g., 13 MHz) lower than that of the high frequency power supplied from the first high frequency power supply 35 to the base 16.

<Configuration of Shower Head 41>

The substrate processing apparatus 10 further includes a shower head 41. The shower head 41 is provided above the mounting table 11 in the processing space 5 in such a manner that a lower surface of the shower head 41 is disposed opposite to an upper surface of the mounting table 11, and the lower surface of the shower head 41 and the upper surface of the mounting table 11 are substantially parallel with each other. The shower head 41 includes an insulating member 42, a main body 43, and an upper ceiling plate 44. The insulating member 42 is made of an insulator and supported at an upper portion of the chamber 1. The main body 43 is made of a conductor, e.g., aluminum having an anodically treated surface. The main body 43 is supported at the chamber 1 through the insulating member 42 to electrically insulate the main body 43 and the chamber 1. The main body 43 and the base 16 serve as an upper electrode and a lower electrode, respectively. The upper ceiling plate 44 is made of a silicon-containing material, e.g., quartz. The upper ceiling plate 44 is disposed below the main body 43 and detachably held to the main body 43.

A gas diffusion space 45, a gas inlet port 46 and a plurality of gas holes 47 are formed in the main body 43. The gas diffusion space 45 is formed in the main body 43. The gas inlet port 46 is formed above the gas diffusion space 45 in the main body 43 and communicates with the gas diffusion space 45. The gas holes 47 are formed from the gas diffusion space 45 toward the upper ceiling plate 44 in the main body 43 and communicate with the gas diffusion space 45. A plurality of gas injection holes 48 is formed in the upper ceiling plate 44. The gas injection holes 48 are formed to extend through an upper surface and a lower surface of the upper ceiling plate 44 and communicate with the gas holes 47, respectively.

The substrate processing apparatus 10 further includes a processing gas supply source (PGS) 51, a valve 52, and a mass flow controller (MFC) 53. The processing gas supply source 51 is connected to the gas inlet port 46 of the main body 43 of the shower head 41 through a line 54. The mass flow controller 53 is disposed in the line 54. In the line 54, the valve 52 is provided between the mass flow controller 53 and the gas inlet port 46. By opening and closing the valve 52, the processing gas is supplied from the processing gas supply source 51 to the gas inlet port 46 or the supply of the processing gas from the processing gas supply source 51 to the gas inlet port 46 is stopped.

The substrate processing apparatus 10 further includes a variable DC power supply 55, a low pass filter (LPF) 56, and a switch 57. The variable DC power supply 55 is electrically connected to the main body 43 of the shower head 41 through an electric line 58. The low pass filter 56 and the switch 57 are provided in the electric line 58. By opening and closing the switch 57, a DC voltage is applied to the shower head 41 or the application of the DC voltage to the shower head 41 is stopped.

The substrate processing apparatus 10 further includes a ring magnet 61. The ring magnet 61 is a permanent magnet and formed in a ring shape. The ring magnet 61 is disposed concentrically with the chamber 1 such that the chamber 1 is disposed at an inner side of the ring magnet 61. The ring magnet 61 is rotatably supported at the chamber 1 through a rotation mechanism (not shown). The ring magnet 61 generates a magnetic field in a region between the shower head 41 and the mounting table 11 in the processing space 5.

The substrate processing apparatus 10 further includes deposition shields 62 and 63, and a conductive member 64. The deposition shield 62 is disposed to cover the inner wall surface of the chamber 1 and detachably attached at the chamber 1. The deposition shield 62 prevents etching by-products (deposits) from being adhered to the inner wall surface of the chamber 1. The deposit shield 63 is disposed to cover an outer peripheral surface of the inner wall member 18. The deposit shield 63 prevents etching by-products from being adhered to the outer peripheral surface of the inner wall member 18. The conductive member 64 is disposed in the processing space at a height substantially equal to a height of a wafer 65 mounted on the electrostatic chuck 17, and is supported at the deposition shield 62. The conductive member 64 is made of a conductor and electrically connected to the ground. The conductive member 64 suppresses abnormal discharge in the chamber 1.

<Configuration of Electrostatic Chuck 17>

Figure 2:
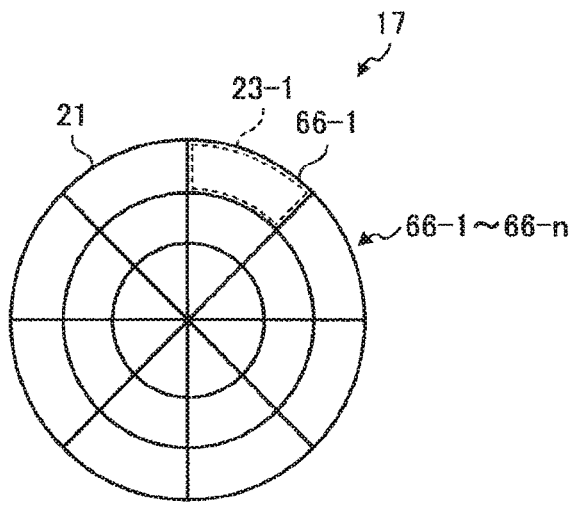
FIG. 2 is a top view showing an example of an electrostatic chuck.

FIG. 2 is a top view showing an example of the electrostatic chuck 17. An upper surface of the electrostatic chuck 17 is divided into a plurality of divided regions 66-1 to 66-$n$. For example, one divided region 66-1 among the divided regions 66-1 to 66-$n$ is disposed to be in contact with the edge of the electrostatic chuck 17. The shapes of the divided regions 66-1 to 66-$n$ are not limited to that shown in FIG. 2. The heaters 23-1 to 23-$n$ are provided in one-to-one correspondence with the divided regions 66-1 to 66-$n$. One heater 23-1 corresponding to one divided region 66-1 is embedded near the divided region 66-1 in the electrostatic chuck body 21 of the electrostatic chuck 17. The heater 23-1 mainly heats the divided region 66-1 of the electrostatic chuck 17 by an AC power supplied thereto. Similarly to the heater 23-1, the other heaters 23-2 to 23-$n$ mainly heat the divided regions 66-2 to 66-$n$ of the electrostatic chuck 17 corresponding thereto by the AC power supplied thereto.

<Configuration of Power Supply Units 32-1 to 32-$n$>

Figure 3:
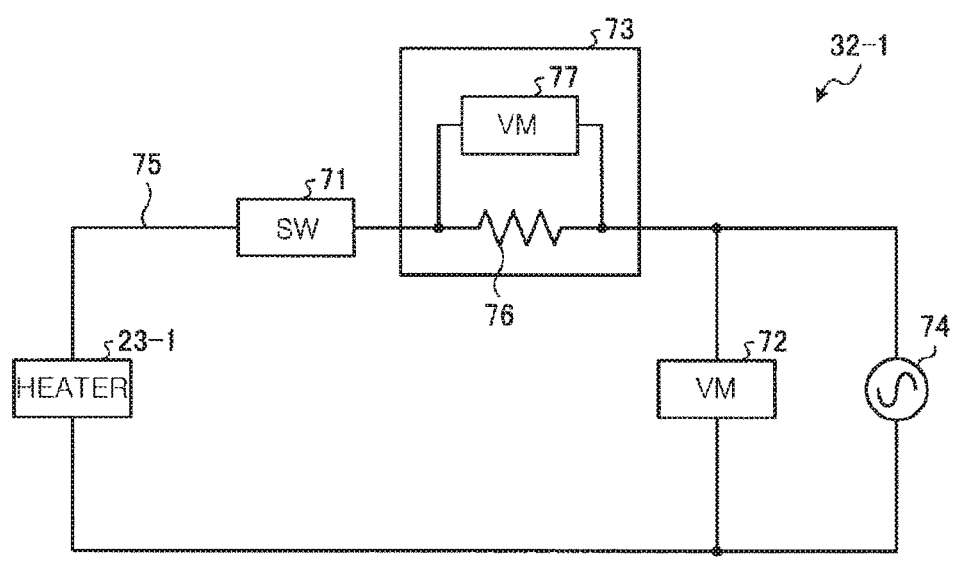
FIG. 3 is a circuit diagram showing an example of one of a plurality of power supply unit which corresponds to one heater.

A plurality of power supply units 32-1 to 32-$n$ are provided in one-to-one correspondence with the heaters 23-1 to 23-$n$. FIG. 3 is a circuit diagram showing an example of one power supply unit 32-1 corresponding to one heater 23-1. The power supply unit 32-1 includes a switch (SW) 71, a voltmeter (VM) 72, and an ammeter 73. The switch 71 is provided in a heater power supply line 75 connecting the AC power supply 74 and the heater 23-1. The AC power supply 74 is provided in a factory where the substrate processing apparatus 10 is installed. The AC power supply 74 supplies the AC power to the substrate processing apparatus 10 and to other devices different from the substrate processing apparatus 10. By opening and closing the switch 71, the power from the AC power supply 74 is supplied to the heater 23-1 and the supply of the power from the AC power supply 74 to the heater 23-1 is stopped. The voltmeter 72 measures a voltage applied to the heater 23-1.

The ammeter 73 includes a shunt resistor 76 and a voltmeter (VM) 77. The shunt resistor 76 is provided in the heater power supply line 75. The resistance of the shunt resistor 76 is, e.g., 10 mΩ. The voltmeter 77 measures the voltage applied to the shunt resistor 76. The ammeter 73 measures an instantaneous value of the current flowing through the heater 23-1 based on the voltage measured by the voltmeter 77. Similarly to the power supply unit 32-1, the other power supply units 32-2 to 32-$n$ supply the power from the AC power supply 74 to the heaters corresponding thereto, and measure the voltage applied to the heaters and the current flowing through the heaters.

<Configuration of Controller 80>

Figure 4:
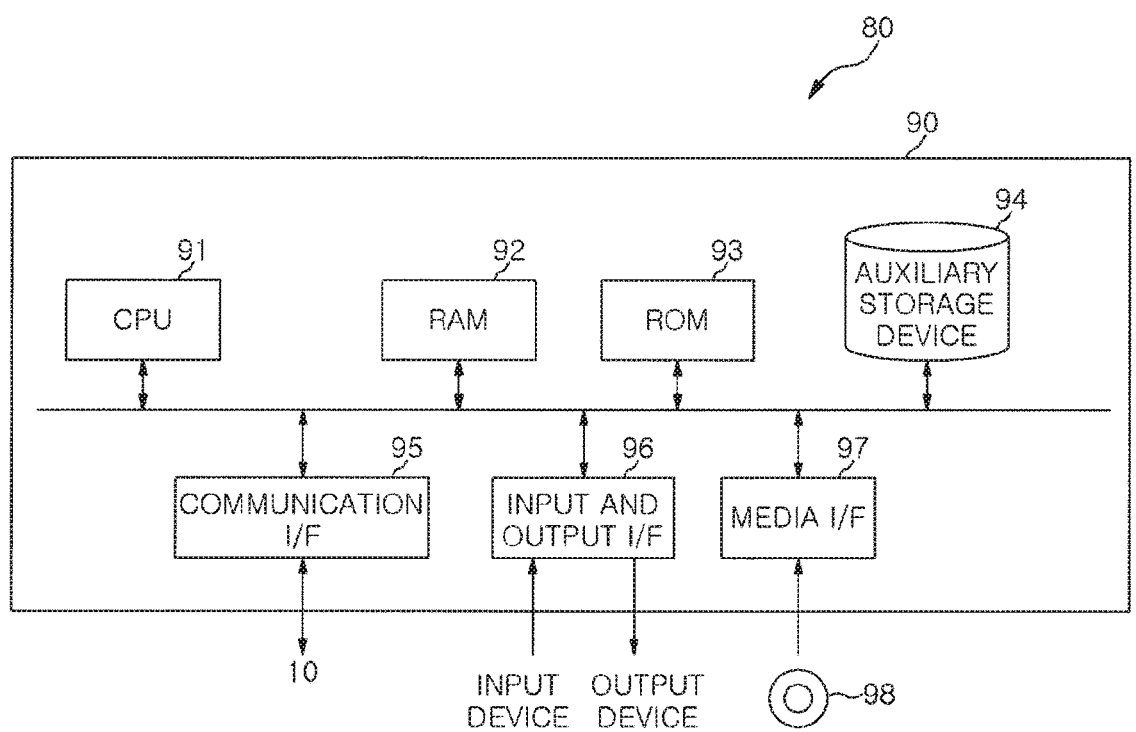
FIG. 4 shows an example of a controller.

The substrate processing apparatus 10 further includes a controller 80, as shown in FIG. 4. FIG. 4 shows an example of the controller 80. The controller 80 is realized by a computer 90. The computer 90 includes a central processing unit (CPU) 91, a random access memory (RAM) 92, and a read only memory (ROM) 93. The CPU 91 operates based on a program installed in the computer 90, controls the respective components of the computer 90, and controls the substrate processing apparatus 10. The ROM 93 stores a boot program executed by the CPU 91 at the time of startup of the computer 90 and a hardware dependent program of the computer 90.

The computer 90 further includes an auxiliary storage device 94, a communication I/F 95, an input and output I/F 96, and a media I/F 97. The auxiliary storage device 94 stores a program executed by the CPU 91 and data used by the program. The auxiliary storage device 94 may be, e.g., a hard disk drive (HDD) and a solid state drive (SSD). The CPU 91 reads out the program from the auxiliary storage device 94, loads the read-out program onto the RAM 92, and executes the loaded program.

The communication I/F 95 communicates with the substrate processing apparatus 10 through a communication line, e.g., a local area network (LAN). The communication I/F 95 sends the information received from the substrate processing apparatus 10 to the CPU 91 through the communication line, and transmits the data generated by the CPU 91 to the substrate processing apparatus 10 through the communication line.

The computer 90 further includes an input device, e.g., a keyboard, and an output device, e.g., a display. The CPU 91 controls the input device and the output device through the input and output I/F 96. The input and output I/F 96 transmits a signal inputted through the input device to the CPU 91, and outputs the data generated by the CPU 91 to the output device.

The media I/F 97 reads out a program or data stored in a non-transitory tangible storage medium 98. The storage medium 98 may be, e.g., an optical storage medium, a magneto-optical storage medium, a tape medium, a magnetic storage medium, or a semiconductor memory. The optical storage medium may be, e.g., a digital versatile disc (DVD) or a phase change rewritable disk (PD). The magneto-optical storage medium may be, e.g., a magneto-optical disk (MO).

The CPU 91 executes to store the program read out from the storage medium 98 in the auxiliary storage device 94 through the media I/F 97. Alternately, the CPU 91 executes to store the program acquired from another device in the auxiliary storage device 94 through the communication line.

Figure 5:
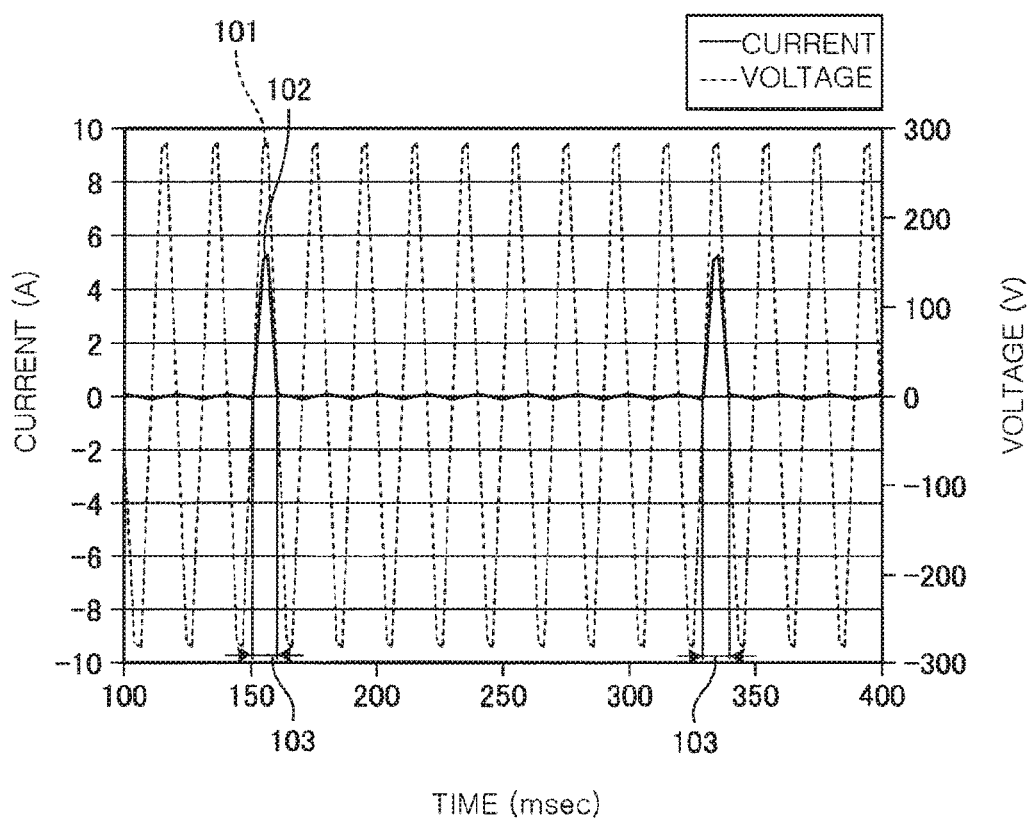
FIG. 5 shows an example of a waveform of an AC voltage outputted from an AC power supply and an example of a waveform of a current flowing through a heater.

FIG. 5 shows an example of a waveform 101 of an AC voltage outputted from the AC power supply 74 and an example of a waveform 102 of a current flowing through the heater 23-1. The waveform 101 of the AC voltage is identical to a sine curve and indicates that the AC power supply 74 outputs an AC voltage of a predetermined frequency (e.g., 50 Hz). The waveform 102 of the current indicates that the power is not supplied from the AC power supply 74 to the heater 23-1 during the period in which the AC voltage is negative. Further, the waveform 102 of the current indicates that the power is supplied from the AC power supply 74 to the heater 23-1 during multiple predetermined conducting periods 103 among a plurality of periods in which the AC voltage is positive.

In other words, the controller 80 controls the switch 71 of the power supply unit 32-1 to be opened to prevent the AC voltage from being applied to the heater 23-1 when the AC voltage outputted from the AC power supply 74 is negative. Further, the controller 80 sets the multiple conducting periods 103 such that a ratio of the multiple conducting periods 103 to a plurality of periods in which the AC voltage is positive becomes a predetermined ratio. Further, the controller 80 controls the switch 71 of the power supply unit 32-1 to be closed to apply the AC voltage to the heater 23-1 during the multiple conducting periods 103.

Figure 6:
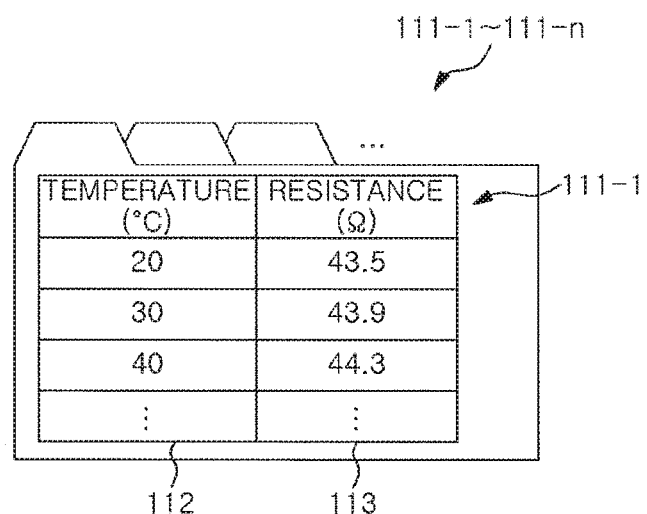
FIG. 6 shows examples of conversion tables.

As shown in FIG. 6, the controller 80 stores a plurality of conversion tables 111-1 to 111-$n$ in the auxiliary storage device 94. FIG. 6 shows examples of the conversion tables 111-1 to 111-$n$. The conversion tables 111-1 to 111-$n$ are provided in one-to-one correspondence with the heaters 23-1 to 23-$n$. In the conversion table 111-1 corresponding to the heater 23-1, a plurality of temperatures 112 is correlated with a plurality of resistances 113. The plurality of temperatures 112 may include, e.g., a set of eleven temperatures from 20° C. to 120° C. in steps of 10° C. The resistance corresponding to a certain temperature indicates the resistance of the heater 23-1 having the certain temperature. In the same manner as the case of the conversion table 111-1, the conversion tables 111-2 to 111-*n* are provided to correspond to the other heaters different from the heater 23-1, and each of the conversion tables 111-2 to 111-*n* correlates temperatures of the heater corresponding thereto with the resistances of the heater, respectively.

The controller 80 further respectively stores a plurality of target temperatures for the heaters 23-1 to 23-*n* in the auxiliary storage device 94. When the AC power is supplied to the heater 23-1, the controller 80 controls the voltmeter 72 of the power supply unit 32-1 to measure an instantaneous value of the voltage applied to the heater 23-1 at an intermediate timing in each of the multiple conducting periods 103. The intermediate timing in each of the multiple conducting periods indicates a timing at which the voltage applied to the heater 23-1 becomes the maximum. In other words, a time period from the beginning to the intermediate timing of each conducting period is approximately equal to a time period from the intermediate timing to the end of each conducting period. The controller 80 controls the ammeter 73 of the power supply unit 32-1 to measure an instantaneous value of the current flowing through the heater 23-1 at an intermediate timing in each of the multiple conducting periods 103. The controller 80 calculates the resistance of the heater 23-1 based on the instantaneous value of the voltage measured by the voltmeter 72 and the instantaneous value of the current measured by the ammeter 73. The resistance of the heater 23-1 is obtained by dividing the instantaneous value of the voltage by the instantaneous value of the current.

The controller 80 obtains the temperature of the heater 23-1 based on the resistance of the heater 23-1 with reference to the conversion table 111-1. When the resistance of the heater 23-1 is equal to a specific one of the resistances 113 in the conversion table 111-1, the temperature of the heater 23-1 is equal to the temperature corresponding to the specific one resistance. When the obtained temperature of heater 23-1 is lower than the target temperature for the heater 23-1 among the target temperatures, the controller 80 controls the multiple conducting periods 103 to increase a ratio of the multiple conducting periods 103 to the periods in which the AC voltage is positive. When the obtained temperature of the heater 23-1 is higher than the target temperature, the controller 80 controls the multiple conducting periods 103 to decrease the ratio of the multiple conducting periods 103 to the periods in which the AC voltage is positive. The controller 80 controls the switch 71 of the power supply unit 32-1 to be opened and closed to supply the AC power from the AC power supply 74 to the heater 23-1 during the increased or decreased conducting periods 103. In the same manner as the case of the heater 23-1, the controller 80 controls the power supply units 32-2 to 32-*n* for the heaters different from the heater 23-1 among the heaters 23-1 to 23-*n* based on the conversion tables 111-2 to 111-*n* and the target temperatures.

<Substrate Processing Method>

A substrate processing method according to one embodiment is performed with the substrate processing apparatus 10 and includes a setup method, a plasma etching method, and an interlock method.

For example, the setup method is carried out when the substrate processing apparatus 10 is installed at a factory or after the plasma etching method is stopped by the interlock method. The controller 80 controls the chiller unit 33 to circulate the coolant cooled to a predetermined temperature through the coolant circulation path 25, thereby cooling the electrostatic chuck 17. The controller 80 controls the switches 71 of the power supply units 32-1 to 32-*n* to be opened and closed to supply reference AC voltages from the AC power supply 74 to the heaters 23-1 to 23-*n*, respectively, thereby heating the electrostatic chuck 17. When the electrostatic chuck 17 is cooled or heated, a user measures the temperatures of the heaters 23-1 to 23-*n* by respectively measuring the temperatures of the divided regions 66-1 to 66-*n* of the electrostatic chuck 17 using temperature sensors (not shown). Each of the temperature sensor may be, e.g., an infrared camera that measures the temperature of each of the divided regions 66-1 to 66-*n* based on the distribution of the emission amount of infrared rays from the upper surface of the electrostatic chuck 17.

When the temperature of the heater 23-1 is measured, the controller 80 controls the voltmeter 72 and the ammeter 73 of the power supply unit 32-1 to measure the reference voltage applied to the heater 23-1 and the reference current flowing through the heater 23-1. The controller 80 calculates the resistance of the heater 23-1 at the timing when the temperature of the heater 23-1 becomes equal to the predetermined temperature. The resistance of the heater 23-1 is obtained by dividing an instantaneous value of the reference voltage measured by the voltmeter 72 by an instantaneous value of the reference current measured by the ammeter 73 at the timing when the temperature of the heater 23-1 becomes equal to the predetermined temperature. The controller 80 calculates the resistances 113 corresponding to the temperatures 112 by calculating the resistance of the heater 23-1 whenever the temperature of the heater 23-1 becomes equal to the respective temperatures 112, and creates the conversion table 111-1.

The controller 80 calculates the resistances 113 corresponding to the temperatures 112 for the other heaters among the heaters 23-1 to 23-*n*, and creates the conversion tables corresponding thereto among the conversion tables 111-1 to 111-*n*. The controller 80 stores the created conversion tables 111-1 to 111-*n* in the auxiliary storage device 94.

In the setup method, the controller 80 respectively calculates a plurality of reference second-period voltage ratios for the heaters 23-1 to 23-*n*. In other words, the controller 80 measures an instantaneous value of the reference voltage applied to the heater 23-1 at a predetermined sampling cycle by controlling the voltmeter 72 during the multiple conducting periods 103 in each of which the reference AC power is supplied to heater 23-1. The sampling cycle is, e.g., 100 μs.

Figure 7:
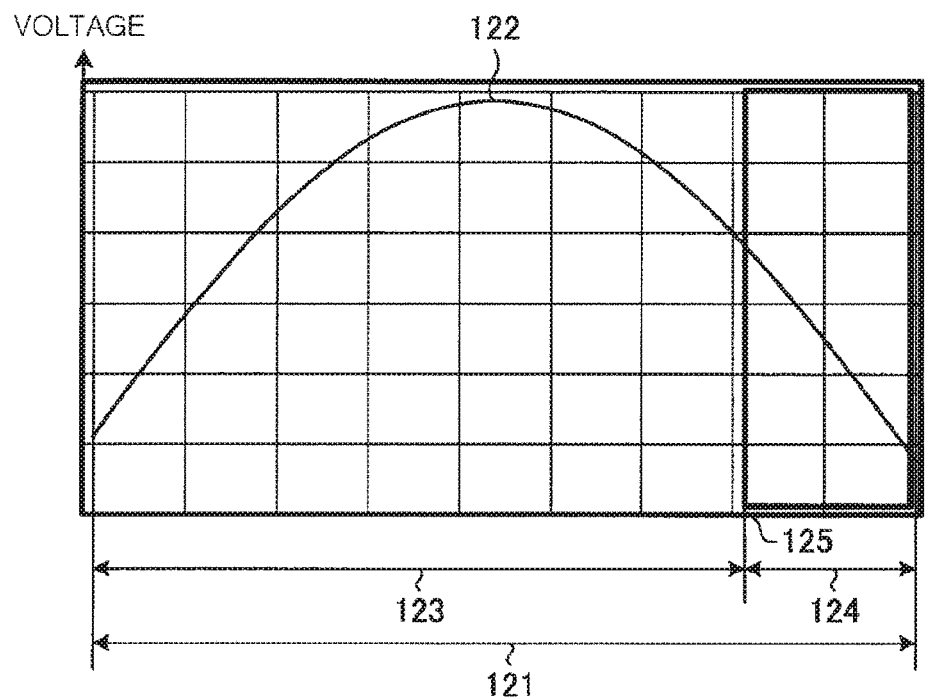
FIG. 7 is a graph showing an example of a change in a reference voltage applied to a heater during one of multiple conducting periods.

FIG. 7 is a graph showing an example of a change 122 in the reference voltage applied to the heater 23-1 during one conducting period 121 among the multiple conducting periods 103. The change 122 in the reference voltage shows a curve that is substantially the same as a half wavelength corresponding to the sine wave of 0° to 180°. One conducting period 121 includes a first period 123 and a second period 124. The first period 123 indicates a time period from the beginning of one conducting period 121 to a predetermined timing 125 (i.e., the former period of one conducting period). The timing 125 indicates a timing at which ¾ of one conducting period 121 has elapsed from the beginning. The second period 124 indicates a time period from the timing 125 to the end of the one conducting period 121 (i.e., the later period of one conducting period). In other words, the length of the second period 124 is equal to ¼ of one conducting period 121.

The controller 80 calculates one reference second-period voltage ratio corresponding to the heater 23-1 among the reference second-period voltage ratios based on a plurality of instantaneous values measured by the voltmeter 72 of the power supply unit 32-1. The reference second-period voltage ratio is obtained by dividing a reference second-period voltage effective value by a total reference voltage effective value. The total reference voltage effective value indicates an effective value of the reference voltage applied to the heater 23-1 during one conducting period 121 and is equal to the root-mean-square (RMS) value of a plurality of instantaneous values measured by the voltmeter 72 during one conducting period 121. The reference second-period voltage effective value indicates an effective value of the reference voltage applied to the heater 23-1 during the second period 124 and is obtained by subtracting a reference first-period voltage effective value from the total reference voltage effective value. The reference first-period voltage effective value indicates an effective value of the reference voltage applied to the heater 23-1 during the first period 123 and is equal to the root-mean-square (RMS) value of a plurality of instantaneous values measured by the voltmeter 72 during the first period 123. For example, the reference second-period voltage ratio is 30.9% to 32% when the change 122 in the reference voltage is substantially the same as the sine wave.

In the same manner as the case of the reference second-period voltage ratio for the heater 23-1, the controller 80 calculates a plurality of reference second-period voltage ratios for the heaters 23-1 to 23-n. The controller 80 stores the calculated reference second-period voltage ratios in the auxiliary storage device 94.

<Plasma Etching Method>

The plasma etching method is performed after the setup method is performed. In the plasma etching method, the controller 80 controls the gate valve 3 to open the opening 7. When the opening 7 is opened, the wafer 65 to be processed is loaded into the processing space 5 of the chamber 1 through the opening 67 and mounted on the mounting table 11. After the wafer 65 is mounted on the mounting table 11, the controller 80 controls the DC power supply 31 to apply a DC voltage to the electrode and allows the wafer 65 to be held on and attracted to the electrostatic chuck 17 by a Coulomb force. After the wafer 65 is held on and attracted to the mounting table 11, the controller 80 controls the gate valve to close the opening 7.

When the opening 7 is closed, the controller 80 controls the gas exhaust unit 2 to evacuate an atmosphere of the processing space 5 to a predetermined vacuum level. Further, the controller 80 controls the valve 52 to supply a predetermined amount of processing gas from the processing gas supply source 51 to the gas inlet port 46. The processing gas supplied from the processing gas supply source 51 to the gas inlet port 46 is supplied to the gas diffusion space 45 and then is supplied and diffused in a shower form to the processing space 5 of the chamber 1 through the gas holes 47 and the gas injection holes 48.

When the wafer 65 is held on and attracted to the electrostatic chuck 17, the controller 80 controls the heat transfer gas supply unit 34 to supply the heat transfer gas to the heat transfer gas supply path 26 and then to the gap between the electrostatic chuck 17 and the wafer 65. Further, the controller 80 controls the chiller unit 33 to circulate the coolant cooled to a predetermined temperature through the coolant circulation path 25, thereby cooling the electrostatic chuck 17.

When the wafer 65 is held on and attracted to the electrostatic chuck 17, the controller 80 controls the opening and closing of the switch 71 of the power supply unit 32-1 to supply the AC power from the AC power supply 74 to the heater 23-1 during the multiple conducting periods 103. Further, the controller 80 controls the voltmeter 72 of the power supply unit 32-1 to measure the instantaneous value of the voltage applied to the heater 23-1 at each of the intermediate timings of the multiple conducting periods 103. Moreover, the controller 80 controls the ammeter 73 of the power supply unit 32-1 to measure the instantaneous value of the current flowing through the heater 23-1 at each of the intermediate timings of the multiple conducting periods 103.

The controller 80 calculates the resistance of the heater 23-1 based on the measured instantaneous value of the current and the instantaneous value of the voltage. The controller 80 obtains, with reference to the conversion table 111-1, the temperature of the heater 23-1 based on the calculated resistance. When the obtained temperature is lower than the target temperature for the heater 23-1 among the target temperatures, the controller 80 controls (changes) the multiple conducting periods 103 to increase a ratio of the multiple conducting periods 103 to the periods in which the AC voltage is positive. When the obtained temperature is higher than the target temperature, the controller 80 controls (changes) the multiple conducting periods 103 to decrease a ratio of the multiple conducting periods 103 to the periods in which the AC voltage is positive. The controller 80 controls the opening and closing of the switch 71 of the power supply unit 32-1 to supply the AC power from the AC power supply 74 to the heater 23-1 during the controlled (changed) conducting periods 103.

Therefore, the controller 80 can control the temperature of the heater 23-1 to the target temperature by changing the ratio of the multiple conducting periods 103 to the periods in which the AC voltage is positive. Similarly, the controller 80 can control the temperatures of the other heaters 23-2 to 23-n different from the heater 23-1 to the target temperatures, respectively. At this time, the temperature of the wafer 65 is controlled to a predetermined temperature by the heat transfer from the electrostatic chuck 17 to the wafer 65 through the heat transfer gas supplied between the electrostatic chuck 17 and the wafer 65.

The controller 80 controls the first high frequency power supply 35 and the second high frequency power supply 36 to supply the high frequency powers to the base 16 of the mounting table 11 when the temperature of the wafer 65 is controlled to the predetermined temperature. In the region between the mounting table 11 and the shower head 41 in the processing space 5, plasma is generated by supplying the high frequency powers to the base 16 of the mounting table 11. The controller 80 controls the variable DC power supply 55 and the switch 57 to apply a predetermined DC voltage to the shower head 41 from the variable DC power supply 55. The wafer 65 is etched by the plasma generated in the processing space 5.

The controller 80 controls the first high frequency power supply 35 and the second high frequency power supply 36 to stop the supply of the high frequency powers to the base 16 of the mounting table 11 after the wafer 65 is appropriately etched. Further, the controller 80 controls the variable DC power supply 55 and the switch 57 to prevent the DC voltage from being applied to the shower head 41. Then, the controller 80 controls the gate valve 3 to open the opening 7. Further, the controller 80 controls the DC power supply 31 to release the holding and attracting of the wafer 65 onto the electrostatic chuck 17. By opening the opening 7, the wafer 65 that is not held on and attracted to the electrostatic chuck 17 is unloaded from the processing space 5 of the chamber 1 through the opening 7. In accordance with the plasma etching method, it is possible to appropriately control the temperature of the wafer 65 to the predetermined temperature and appropriately etch the wafer 65.

<Interlock Method>

The interlock method is performed in parallel with the plasma etching method. In other words, the interlock method is performed while the plasma etching method is performed. First, the controller 80 controls the voltmeter 72 of the power supply unit 32-1 to measure an instantaneous value of the voltage applied to the heater 23-1 at a predetermined sampling cycle. In the similar manner to the case of the reference second-period voltage ratio, the controller 80 calculates a second-period voltage ratio based on a plurality of instantaneous values measured during one conducting period 121. The second-period voltage ratio is obtained by dividing a second-period voltage effective value by a total voltage effective value. The total voltage effective value indicates an effective value of the voltage applied to the heater 23-1 during one conducting period 121 and is equal to the root-mean-square (RMS) value of a plurality of instantaneous values measured by the voltmeter 72 during one conducting period 121. The second-period voltage effective value indicates an effective value of the voltage applied to the heater 23-1 during the second period 124 and is obtained by subtracting a first-period voltage effective value from the total voltage effective value. The first-period voltage effective value indicates an effective value of the voltage applied to the heater 23-1 during the first period 123 and is equal to the root-mean-square (RMS) value of a plurality of instantaneous values measured by the voltmeter 72 during the first period 123.

The controller 80 compares the calculated second-period voltage ratio with the reference second-period voltage ratio corresponding to the heater 23-1 among the reference second-period voltage ratios calculated by the setup method. The controller 80 controls the power supply units 32-1 to 32-$n$ to stop the power supply to the heaters 23-1 to 23-$n$ when the value obtained by subtracting the reference second-period voltage ratio from the second-period voltage ratio is greater than a predetermined threshold (e.g., 5%). Further, the controller 80 controls the substrate processing apparatus 10 to stop the plasma etching method when the value obtained by subtracting the reference second-period voltage ratio from the second-period voltage ratio is greater than the predetermined threshold.

In the same manner as the case of the second-period voltage ratio of the heater 23-1, the controller 80 respectively calculates a plurality of second-period voltage ratios for the heaters 23-2 to 23-$n$. Further, when the difference between the second-period voltage ratio and the reference second-period voltage ratio for each of the heaters different from the heater 23-1 is greater than a predetermined threshold value, the controller 80 stops the power supply to the heaters 23-2 to 23-$n$ and further stops the plasma etching method.

Figure 8:
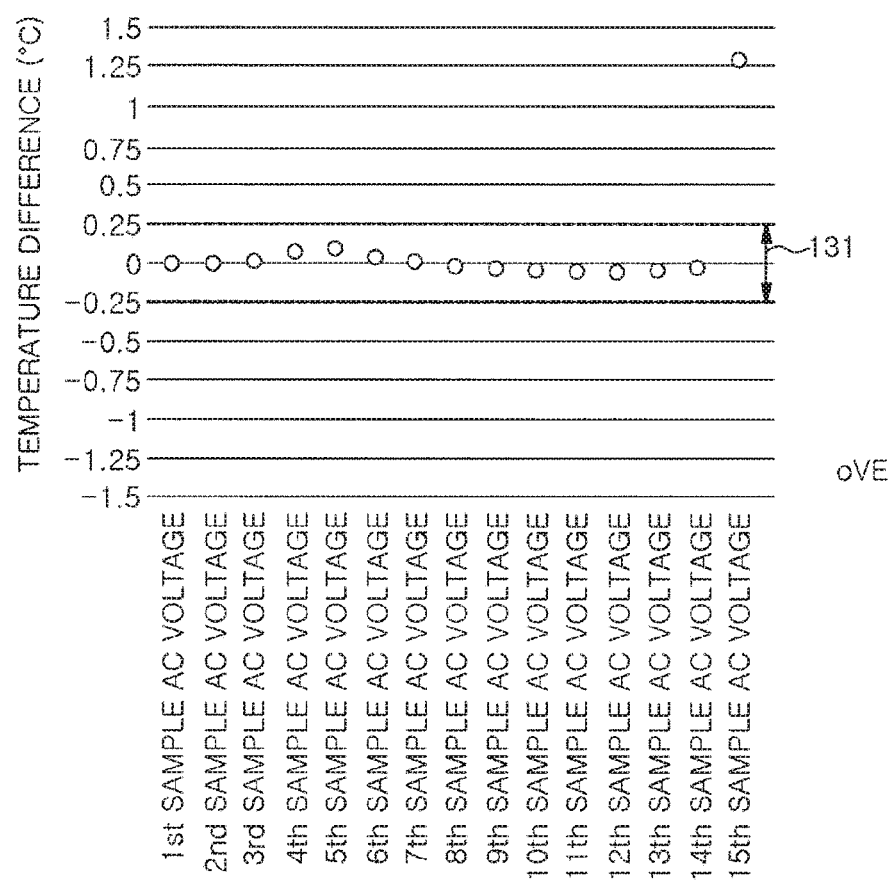
FIG. 8 is a graph showing a plurality of exemplary temperatures corresponding to a plurality of sample AC voltages in a power supply waveform fluctuation test.

FIG. 8 is a graph showing a plurality of exemplary temperatures corresponding to a plurality of sample AC voltages in a power supply waveform fluctuation test. In the power supply waveform fluctuation test, the AC power supply 74 of the substrate processing apparatus 10 is replaced with a programmable power supply. The programmable power supply is configured to output a plurality of sample AC voltages having different waveforms. In FIG. 8, the sample AC voltages are correlated with a plurality of temperatures. Among the temperatures, a temperature corresponding to a certain sample AC voltage indicates, e.g., a temperature of the heater 23-1 when the power supply unit 32-1 is controlled to make the temperature of the heater 23-1 equal to 60° C. by using the sample AC voltage. The sample AC voltages include the first to the fifteenth sample AC voltages.

Figure 9:
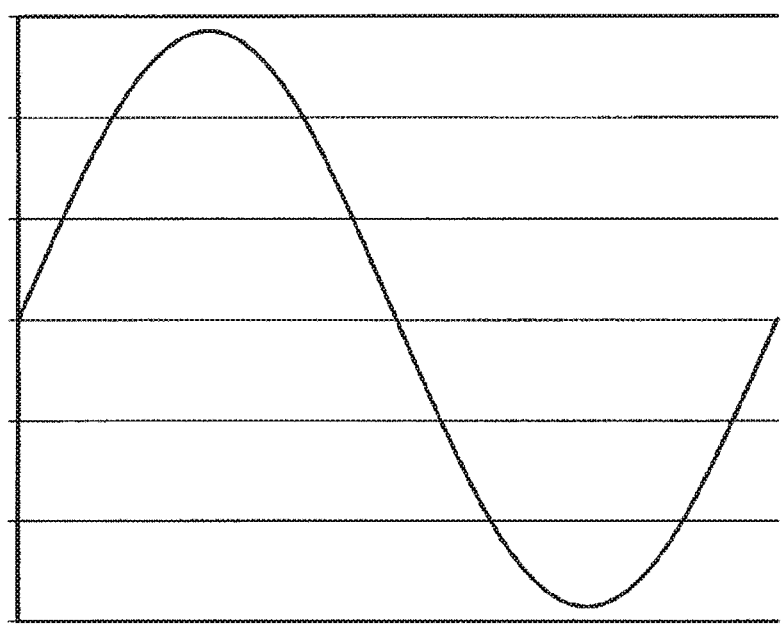
FIG. 9 shows an example of a waveform of a first sample AC voltage.

FIG. 9 shows an example of a waveform of the first sample AC voltage. As shown in FIG. 9, the first sample AC voltage among the sample AC voltages indicates an AC voltage that changes in the same pattern as a sine wave. The second sample AC voltage among the sample AC voltages indicates an AC voltage that is instantaneously decreased to 75% at a timing corresponding to 60° of the first sample AC voltage. The third sample AC voltage among the sample AC voltages indicates an AC voltage that is instantaneously decreased to 75% at a timing corresponding to 70° of the first sample AC voltage. The fourth sample AC voltage among the sample AC voltages indicates an AC voltage that is instantaneously decreased to 75% at a timing corresponding to 80° of the first sample AC voltage.

Figure 10:
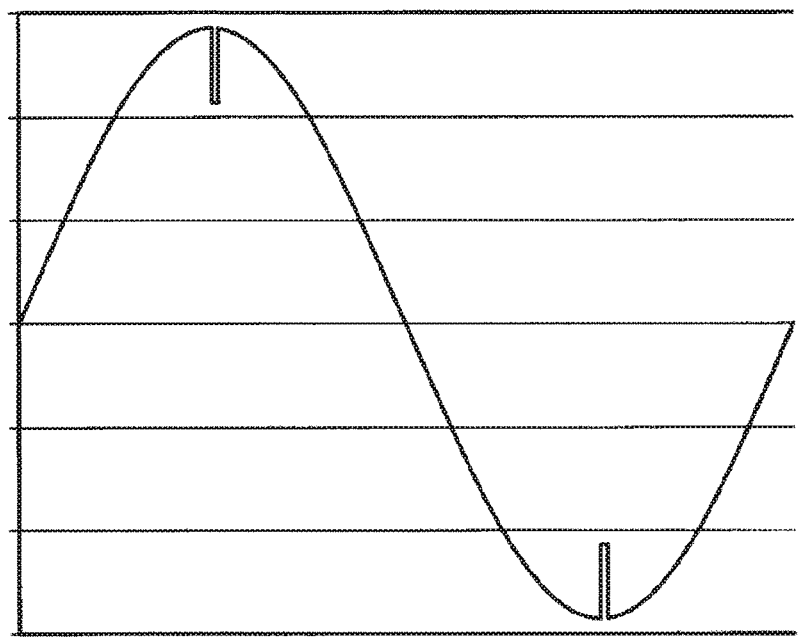
FIG. 10 shows an example of a waveform of a fifth sample AC voltage.

FIG. 10 shows an example of a waveform of the fifth sample AC voltage. As shown in FIG. 10, the fifth sample AC voltage among the sample AC voltages indicates an AC voltage that is instantaneously decreased to 75% at a timing corresponding to 90° of the first sample AC voltage. The sixth sample AC voltage among the sample AC voltages indicates an AC voltage that is instantaneously decreased to 75% at a timing corresponding to 100° of the first sample AC voltage. The seventh sample AC voltage among the sample AC voltages indicates an AC voltage that is instantaneously decreased to 75% at a timing corresponding to 110° of the first sample AC voltage.

Figure 11:
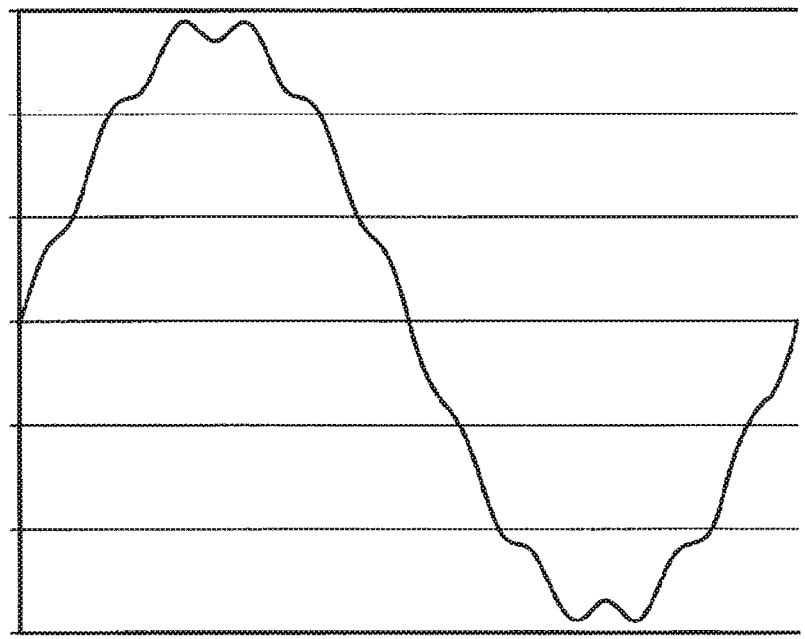
FIG. 11 shows an example of a waveform of a ninth sample AC voltage.

The eighth sample AC voltage among the sample AC voltages indicates an AC voltage in which a $7^{th}$ harmonic of 3% of the first sample AC voltage is superimposed on the first sample AC voltage. FIG. 11 shows an example of a waveform of the ninth sample AC voltage. As shown in FIG. 1, the ninth sample AC voltage among the sample AC voltages indicates an AC voltage in which a $9^{th}$ harmonic of 5% of the first sample AC voltage is superimposed on the first sample AC voltage. The tenth sample AC voltage among the sample AC voltages indicates an AC voltage in which an $11^{th}$ harmonic of 5% of the first sample AC voltage is superimposed on the first sample AC voltage. An eleventh sample AC voltage among the sample AC voltages indicates an AC voltage in which a $13^{th}$ harmonic of 5% of the first sample AC voltage is superimposed on the first sample AC voltage.

Figure 12:
FIG. 12 shows an example of a waveform of a fourteenth sample AC voltage.
Figure 13:
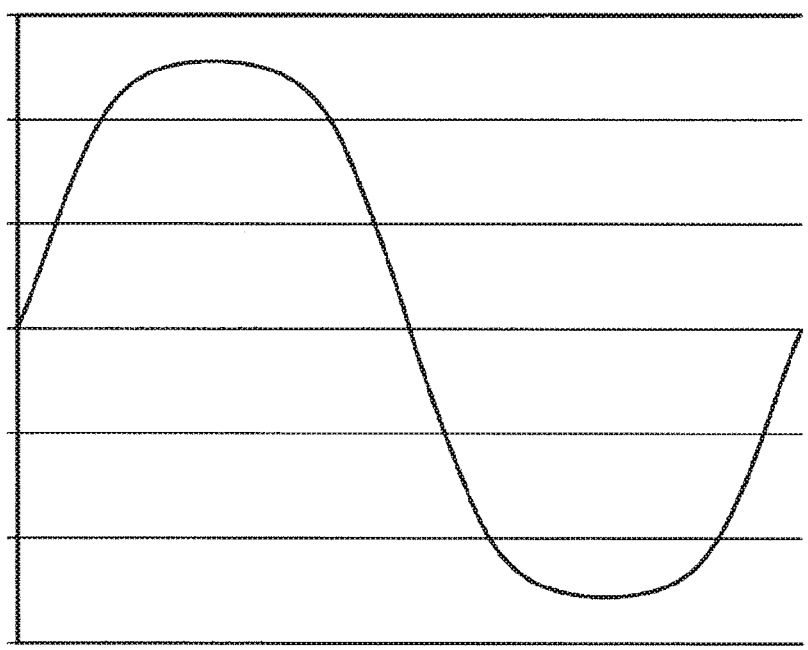
FIG. 13 shows an example of a waveform of a fifteenth sample AC voltage.

The twelfth sample AC voltage among the sample AC voltages indicates an AC voltage in which a $15^{th}$ harmonic of 5% of the first sample AC voltage is superimposed on the first sample AC voltage. The thirteenth sample AC voltage among the sample AC voltages indicates an AC voltage in which a $17^{th}$ harmonic of 5% of the first sample AC voltage is superimposed on the first sample AC voltage. FIG. 12 shows an example of a waveform of the fourteenth sample AC voltage. As shown in FIG. 12, the fourteenth sample AC voltage among the sample AC voltages is an AC voltage in which a $9^{th}$ harmonic of 5% of the first sample AC voltage is superimposed on the first sample AC voltage. FIG. 13 shows an example of a waveform of the fifteenth sample AC voltage. As shown in FIG. 13, the fifteenth sample AC voltage among the sample AC voltages is an AC voltage in which a $3^{rd}$ harmonic of 10% of the first sample AC voltage is superimposed on the first sample AC voltage. Here, the first to the fifteenth sample AC voltages have substantially the same voltage effective value.

FIG. 8 shows that the temperatures corresponding to the first to the fourteenth sample AC voltages are included in a predetermined temperature range 131. Further, FIG. 8 shows that the temperature corresponding to the fifteenth sample AC voltage is not included in the predetermined temperature range 131. The temperature range 131 indicates a range from a temperature lower than the temperature corresponding to the first sample AC voltage by 0.25° C. to a temperature higher than the temperature corresponding to the first sample AC voltage by 0.25° C. In other words, FIG. 8 shows that when any of the first to the fourteenth sample AC voltages is outputted from the AC power supply 74, the controller 80 can appropriately control the temperature of the heater 23-1. However, FIG. 8 shows that when the AC voltage outputted from the AC power supply 74 is changed from any of the first to the fourteenth sample AC voltages to the fifteenth sample AC voltage, the controller 80 cannot appropriately control the temperature of the heater 23-1.

Figure 14:
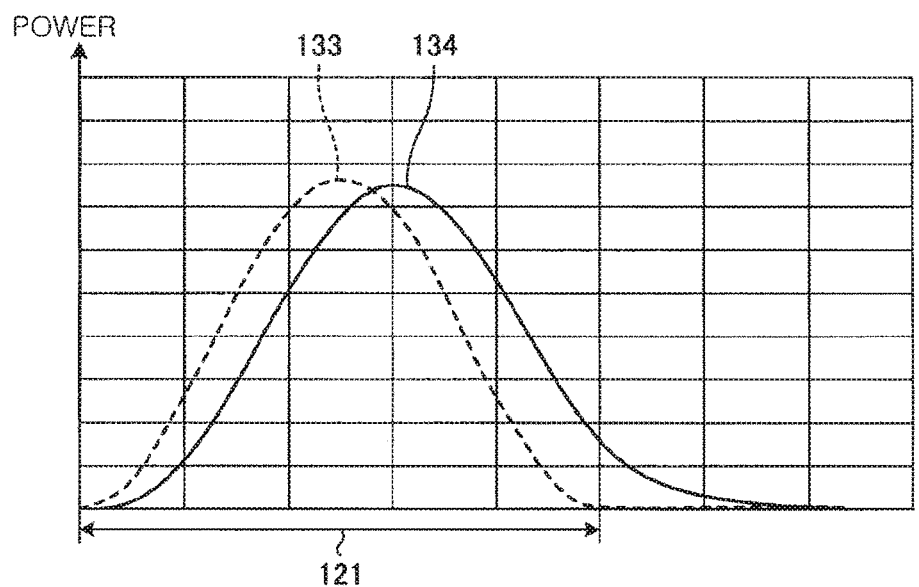
FIG. 14 is a graph showing an example of a change in a resistance of a heater in the case of applying a half wavelength of the first sample AC voltage to the heater.

The change in the temperature of the heater 23-1 in the case that each of the sample AC voltages is applied to the heater 23-1 can be calculated by simulation using a mathematical model. FIG. 14 is a graph showing an example of the change in the resistance of the heater 23-1 in the case that a half wavelength of the first sample AC voltage is applied to the heater 23-1. A curve 133 in FIG. 14 indicates a change in the first sample AC voltage. A curve 134 indicates a change in the resistance of the heater 23-1. FIG. 14 shows that when the half wavelength of the first sample AC voltage is applied to the heater 23-1, a first delay occurs until the change in the power supplied to the heater 23-1 results in the change in the resistance of the heater 23-1. In other words, FIG. 14 shows that the first delay occurs until the change in the voltage applied to the heater 23-1 results in the change in the temperature of the heater 23-1.

Figure 15:
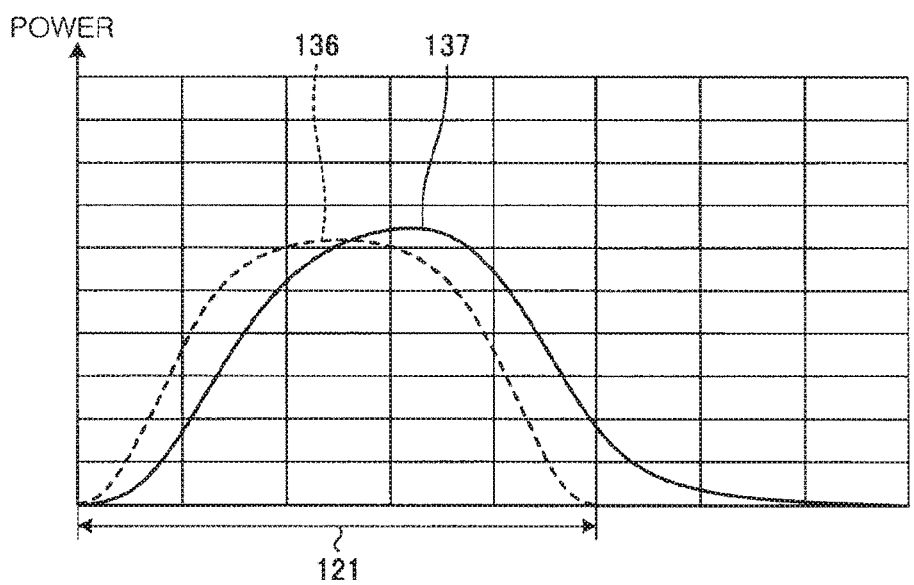
FIG. 15 is a graph showing an example of a change in a resistance of a heater in the case of applying a half wavelength of the fifteenth sample AC voltage to the heater.

FIG. 15 is a graph showing an example of a change in the resistance of the heater 23-1 in the case that a half wavelength of the fifteenth sample AC voltage is applied to the heater 23-1. A curve 136 in FIG. 15 indicates a change in the fifteenth sample AC voltage. A curve 137 indicates a change in the resistance of the heater 23-1. Similarly to FIG. 14, FIG. 15 shows that the first delay occurs until the change in the voltage applied to the heater 23-1 results in the change in the temperature of the heater 23-1. FIGS. 14 and 15 show that the temperature of the heater 23-1 at the timing at which the application of the fifteenth sample AC voltage is completed is higher than the temperature of the heater 23-1 at the timing at which the application of the first sample AC voltage is completed. In other words, FIGS. 14 and 15 show that even when the effective values of the voltages applied to the heater 23-1 are the same, the temperature of the heater 23-1 may be different if the waveforms of the voltages applied to the heater 23-1 are different.

Figure 16:
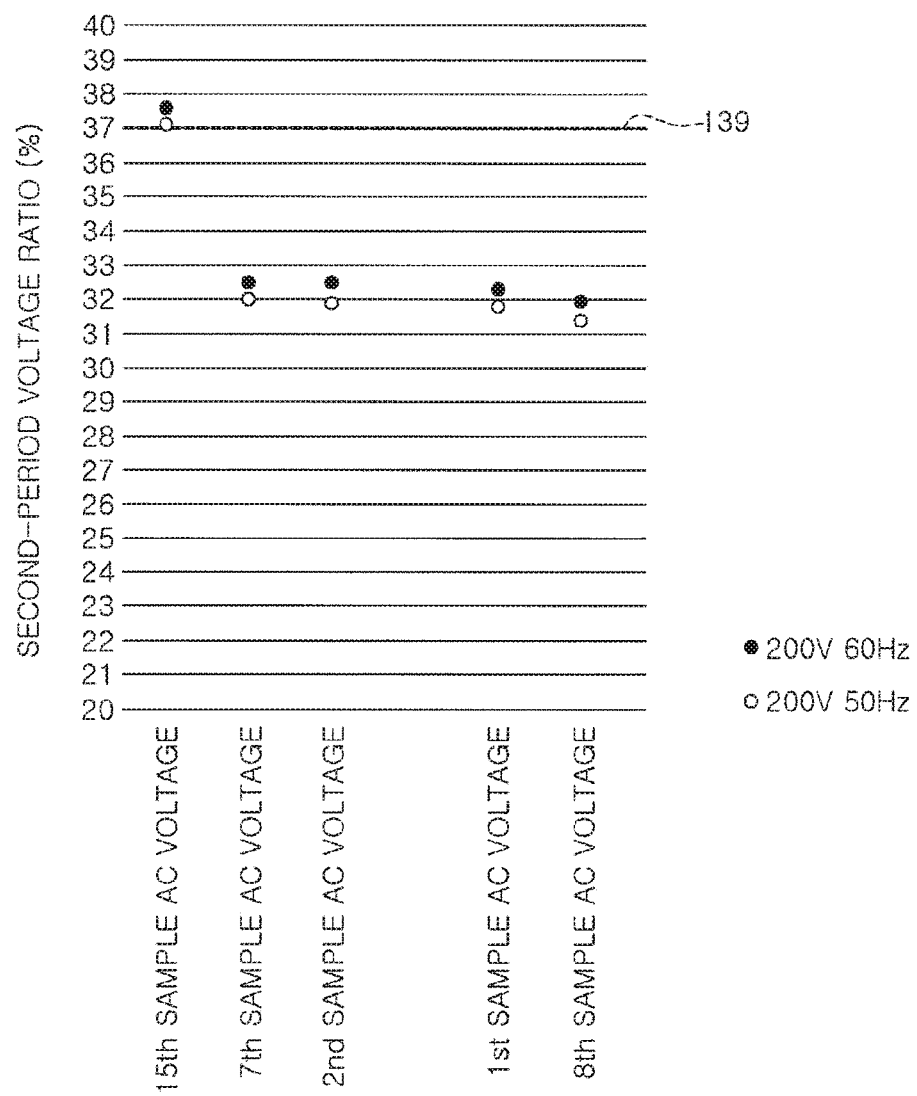
FIG. 16 is a graph showing an example of second-period voltage ratios corresponding to the plurality of sample AC voltages.

FIG. 16 is a graph showing an example of second-period voltage ratios corresponding to the sample AC voltages. FIG. 16 shows that the second-period voltage ratios of the first to the fourteenth sample AC voltages are included in a predetermined range and are smaller than a predetermined threshold 139 (e.g., 37%). Further, FIG. 16 shows that the second-period voltage ratio of the fifteenth sample AC voltage is greater than the predetermined threshold value 139 and is not included in the predetermined range.

FIGS. 8 and 16 show that when the sample AC voltage corresponding to the second-period voltage ratio smaller than the predetermined threshold value 139 is outputted from the AC power supply 74, the temperature of the heater 23-1 controlled by the controller 80 is included in the predetermined temperature range 131. However, FIGS. 8 and 16 show that when the sample AC voltage corresponding to the second-period voltage ratio greater than the predetermined threshold value 139 is outputted from the AC power supply 74, the temperature of the heater 23-1 controlled by the controller 80 is not included in the predetermined temperature range 131. In other words, FIGS. 8 and 16 show that when the sample AC voltage corresponding to the second-period voltage ratio smaller than the predetermined threshold value 139 is outputted from the AC power supply 74, the controller 80 appropriately controls the temperature of the heater 23-1. Further, FIGS. 8 and 16 show that when the sample AC voltage corresponding to the second-period voltage ratio greater than the predetermined threshold value 139 is outputted from the AC power supply 74, the temperature of the heater 23-1 is not appropriately controlled and the temperature abnormality may occur.

Therefore, the substrate processing method determines whether or not the temperature is appropriately controlled by calculating the second-period voltage ratio. The substrate processing method appropriately interlocks the plasma etching process based on the determination of whether or not the temperature is appropriately controlled and reduce the influence of the temperature abnormality on the wafer 65.

The substrate processing method according to one embodiment includes: measuring the change in the voltage applied to the heater 23-1, and determining whether or not the abnormality has occurred in the temperature of the wafer 65 based on the change in the voltage. The substrate processing method further includes: stopping the processing of the wafer 65 when it is determined that the abnormality has occurred. When the waveform of the voltage applied to the heater 23-1 is different from the waveform of the reference voltage, the temperature of the heater 23-1 may be considerably different from the target temperature. The substrate processing method described above is capable of appropriately determining the abnormality in the temperature of the wafer 65 by determining whether or not the temperature is appropriately controlled based on the change in the voltage applied to the heater 23-1. Further, with the substrate processing method described above, it is possible to reduce the influence of the temperature abnormality on the wafer 65 by determining whether or not the temperature is appropriately controlled.

Further, the substrate processing method of one embodiment includes: measuring the current flowing through the heater 23-1; and obtaining, with reference to the conversion table 111-1, the temperature of the heater 23-1 from the resistance of the heater 23-1 calculated based on the voltage and the current. In the conversion table 111-1, a plurality of resistances 113 is correlated with a plurality of temperatures 112. The substrate processing method further includes: controlling a switch 71 for supplying the power from the AC power supply 74 to the heater 23-1 or stopping the supply of the power from the AC power supply 74 to the heater 23-1 based on the obtained temperature. The substrate processing method described above is capable of appropriately determining the temperature abnormality of the wafer 65 by determining whether or not the temperature is appropriately controlled based on the change in the voltage applied to the heater 23-1 for heating the wafer 65.

Further, the substrate processing method according to one embodiment includes: measuring the change in the reference voltage applied to the heater 23-1 during the reference period in which the reference power is supplied to the heater 23-1; and measuring the change in the current flowing through the heater 23-1. The substrate processing method further includes: measuring the change in the temperature of the heater 23-1 during the reference period; and creating the conversion table 111-1 based on the change in the reference voltage, the change in the reference current, and the change in the temperature of the heater 23-1. Here, the determination of whether or not the abnormality has occurred mainly depends on the change in the reference voltage. In the substrate processing method, the change in the reference voltage used in creating the conversion table 111-1 for controlling the temperature of the heater 23-1 is used in determining whether or not the temperature abnormality has occurred. Therefore, it is possible to appropriately determine the temperature abnormality of the wafer W.

Further, in the substrate processing method of one embodiment, the abnormality occurrence is determined based on the second-period voltage ratio obtained by dividing the second-period voltage effective value by the total voltage effective value. Here, the total voltage effective value indicates the effective value of the voltage applied to the heater 23-1 during the conducting period 121 in which the power is supplied to the heater 23-1. The second-period voltage effective value indicates the effective value of the voltage applied to the heater 23-1 during the second period 124 from one timing 125 of the conducting period 121 to the end of the conducting period 121. In the substrate processing method, the second-period voltage ratio is used in determining whether or not the abnormality occurs in the temperature control. Therefore, it is possible to appropriately determine the temperature abnormality of the wafer W.

Further, in the substrate processing method of one embodiment, the length of the second period 124 is equal to ¼ of the length of the conducting period 121. In this case, the second-period voltage ratio is appropriately used for determining whether or not the abnormality has occurred, and the substrate processing method can determine whether or not the temperature is appropriately controlled and reduce the influence of the temperature abnormality on the wafer 65.

The substrate processing method according to one embodiment includes: calculating the total voltage effective value based on the change in the voltage measured during the conducting period 121; and calculating the first-period voltage effective value based on the change in the voltage measured during the first period 123. The substrate processing method further includes: calculating the second-period voltage effective value by subtracting the first-period voltage effective value from the total voltage effective value. Since it is difficult to appropriately determine the end of the conducting period 121 compared to the beginning of the conducting period 121 and the timing 125, a large error may occur when the second-period voltage effective value is calculated based on the voltage measured during the second period 124. In the substrate processing method described above, the second-period voltage effective value is calculated from the first-period voltage effective value and the total voltage effective value, and thus the second-period voltage ratio is appropriately calculated. The substrate processing method can determine whether or not the temperature is appropriately controlled and reduce the influence of the temperature abnormality on the wafer 65 by appropriately calculating the second-period voltage ratio.

In the substrate processing method described above, the second-period voltage effective value is calculated by subtracting the first-period voltage effective value from the total voltage effective value. However, the second-period voltage effective value may be calculated based on the voltage measured by the voltmeter 72 during the first period 123. In that case as well, the substrate processing method can determine whether or not the temperature is appropriately controlled and reduce the influence of the temperature abnormality on the wafer 65.

In the substrate processing method described above, the length of the second period 124 is equal to ¼ of the length of the conducting period 121. However, the length of the second period 124 may be different from ¼ of the length of the conducting period 121. For example, the length of the second period 124 may be equal to ⅕ of the length of the conducting period 121. In that case as well, the substrate processing method can determine whether or not the temperature is appropriately controlled and reduce the influence of the temperature abnormality on the wafer 65.

In the substrate processing method described above, the determination of whether or not the temperature abnormality has occurred is made based on the change in the voltage applied to the heater 23-1. On the other hand, the determination of whether or not the temperature is appropriately controlled may be made based on the change in the voltage applied to a component different from the heater 23-1. In that case as well, the substrate processing method can determine whether or not the temperature is appropriately controlled and reduce the influence of the temperature abnormality on the wafer 65.

The substrate processing apparatus 10 according to one embodiment includes the voltmeter 72 configured to measure the change in the voltage applied to the heater 23-1, and the controller 80 configured to determine whether or not the abnormality has occurred in the temperature of the wafer 65 based on the change in the voltage. The controller 80 controls the substrate processing apparatus 10 to stop the processing of the wafer 65 when it is determined that the abnormality has occurred. With the substrate processing apparatus 10, it is possible to determine whether or not the temperature is appropriately controlled based on the change in the voltage applied to the heater 23-1. Further, the influence of the temperature abnormality on the wafer 65 can also be reduced by determining whether or not the temperature is appropriately controlled.

In the substrate processing apparatus 10 described above, plasma is used to etch the wafer 65. The plasma may be, e.g., capacitively coupled plasma (CCP), inductively coupled plasma (ICP), a radial line slot antenna, electron cyclotron resonance plasma (ECR), and helicon wave plasma (HWP).

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A substrate processing method comprising:
measuring a change in a voltage applied to a component provided in a substrate processing apparatus configured to process a substrate and a current flowing through the component;
obtaining a temperature of the component from a change in a resistance calculated based on the voltage and current with reference to a conversion table in which a plurality of resistances is correlated with a plurality of temperatures;

determining whether or not abnormality has occurred in a temperature of the substrate based on the change in the voltage; and stopping processing of the substrate when it is determined that the abnormality has occurred in said determining.

2. The substrate processing method of claim 1, further comprising:
measuring a change in a reference voltage applied to the component during a reference period in which a reference power is supplied to the component;
measuring a change in a reference current flowing through the component during the reference period;
measuring a change in a temperature of the component during the reference period; and
creating the conversion table based on the change in the reference voltage, the change in the reference current, and the change in the temperature of the component,
wherein said determining whether or not the abnormality has occurred is made based on the change in the reference voltage.

3. The substrate processing method of claim 2, wherein said determining whether or not the abnormality has occurred is made based on an effective value calculated based on the change in the voltage.

4. The substrate processing method of claim 2,
wherein said determining whether or not the abnormality has occurred is made based on a voltage ratio obtained by dividing a second effective value by a first effective value, the first and the second effective values being calculated based on the change in the voltage,
wherein the first effective value is an effective value of a voltage applied to the component during a conducting period in which power is supplied to the component; and
the second effective value is an effective value of a voltage applied to the component during a period from a predetermined timing of the conducting period to the end of the conducting period.

5. The substrate processing method of claim 4, wherein a length of the period from a predetermined timing of the conducting period to the end of the conducting period is equal to ¼ of a length of the conducting period.

6. The substrate processing method of claim 1, wherein said determining whether or not the abnormality has occurred is made based on an effective value calculated based on the change in the voltage.

7. The substrate processing method of claim 1,
wherein said determining whether or not the abnormality has occurred is made based on a voltage ratio obtained by dividing a second effective value by a first effective value, the first and the second effective values being calculated based on the change in the voltage,
wherein the first effective value is an effective value of a voltage applied to the component during a conducting period in which power is supplied to the component; and
the second effective value is an effective value of a voltage applied to the component during a period from a predetermined timing of the conducting period to the end of the conducting period.

8. The substrate processing method of claim 7, wherein a length of the period from a predetermined timing of the conducting period to the end of the conducting period is equal to ¼ of a length of the conducting period.

9. The substrate processing method of claim 8, further comprising:

calculating the first effective value based on a change in a voltage measured during the conducting period;
calculating a third effective value that is an effective value of a voltage applied to the component during a period from the beginning of the conducting period to the predetermined timing of the conducting period, wherein the third effective value is calculated based on a change in a voltage measured during the period from the beginning of the conducting period to the predetermined timing of the conducting period; and
calculating the second effective value by subtracting the third effective value from the first effective value.

10. The substrate processing method of claim 7, further comprising:
calculating the first effective value based on a change in a voltage measured during the conducting period;
calculating a third effective value that is an effective value of a voltage applied to the component during a period from the beginning of the conducting period to the predetermined timing of the conducting period, wherein the third effective value is calculated based on a change in a voltage measured during the period from the beginning of the conducting period to the predetermined timing of the conducting period; and
calculating the second effective value by subtracting the third effective value from the first effective value.

11. The substrate processing method of claim 1, wherein said stopping the processing of the substrate is performed by controlling a switch for supplying power or stopping a supply of power to the component from an AC power supply based on the temperature of the component.

12. The substrate processing method of claim 1, wherein the component is a heater configured to heat the substrate by power supplied thereto.

13. The substrate processing method of claim 1, wherein a plurality of instantaneous voltage values is measured during a conducting period in which power is supplied to the component, the conducting period including a first period and a second period,
wherein a second-period voltage ratio is calculated based on the plurality of instantaneous voltage values, and
wherein said determining whether or not the abnormality has occurred is made based on the second-period voltage ratio.

14. A substrate processing apparatus comprising:
a processing unit configured to process a substrate;
a voltmeter configured to measure a change in a voltage applied to a component provided in the processing unit;
an ammeter configured to measure a current flowing through the component; and
a controller configured to obtain a temperature of the component from a resistance calculated based on the voltage and the current with reference to a conversion table in which a plurality of resistances is correlated with a plurality of temperatures,
wherein the controller determines whether or not an abnormality has occurred in a temperature of the substrate based on the change in the voltage and controls the processing unit to stop processing of the substrate when it is determined that the abnormality has occurred.

15. The substrate processing apparatus of claim 14, wherein a plurality of instantaneous voltage values is measured during a conducting period in which power is supplied to the component, the conducting period including a first period and a second period, wherein a second-period voltage ratio is calculated based on the plurality of instantaneous voltage values, and wherein the controller determines whether or not the abnormality has occurred based on the second-period voltage ratio.

16. The substrate processing apparatus of claim 14, wherein the controller determines whether or not the abnormality has occurred based on a voltage ratio obtained by dividing a second effective value by a first effective value, the first and the second effective values being calculated based on the change in the voltage, wherein the first effective value is an effective value of a voltage applied to the component during a conducting period in which power is supplied to the component, and wherein the second effective value is an effective value of a voltage applied to the component during a period from a predetermined timing of the conducting period to the end of the conducting period.

17. The substrate processing apparatus of claim 16, wherein the controller calculates the first effective value based on a change in a voltage measured during the conducting period, wherein the controller calculates a third effective value that is an effective value of a voltage applied to the component during a period from the beginning of the conducting period to the predetermined timing of the conducting period, wherein the third effective value is calculated based on a change in a voltage measured during the period from the beginning of the conducting period to the predetermined timing of the conducting period, and wherein the controller calculates the second effective value by subtracting the third effective value from the first effective value.

18. The substrate processing apparatus of claim 14, wherein the voltmeter measures a change in a reference voltage applied to the component during a reference period in which a reference power is supplied to the component, wherein the ammeter measures a change in a reference current flowing through the component during the reference period, wherein a change in a temperature of the component is measured during the reference period, wherein the controller creates the conversion table based on the change in the reference voltage, the change in the reference current, and the change in the temperature of the component, wherein the controller determines whether or not the abnormality has occurred based on a voltage ratio obtained by dividing a second effective value by a first effective value, the first and the second effective values being calculated based on the change in the voltage, wherein the first effective value is an effective value of a voltage applied to the component during a conducting period in which power is supplied to the component, and wherein the second effective value is an effective value of a voltage applied to the component during a period from a predetermined timing of the conducting period to the end of the conducting period.

19. The substrate processing apparatus of claim 14, wherein the controller stops the processing of the substrate by controlling a switch for supplying power or stopping a supply of power to the component from an AC power supply based on the temperature of the component.

20. The substrate processing apparatus of claim 14, wherein the component is a heater configured to heat the substrate by power supplied thereto.

* * * * *